United States Patent [19]

Karash

[11] Patent Number: 4,520,416
[45] Date of Patent: May 28, 1985

[54] SHUNT-FOLDBACK VOLTAGE SOURCE
[75] Inventor: Karl Karash, Sudbury, Mass.
[73] Assignee: GenRad, Inc., Concord, Mass.
[21] Appl. No.: 585,153
[22] Filed: Mar. 1, 1984
[51] Int. Cl.$^3$ ............................................. H02H 7/22
[52] U.S. Cl. ...................................... 361/11; 361/10; 361/55; 361/58; 361/111; 307/135
[58] Field of Search ...................... 361/11, 10, 9, 2, 1, 361/55, 54, 58, 111, 18; 307/135, 134; 323/908, 276

[56] References Cited

U.S. PATENT DOCUMENTS

| | | |
|---|---|---|
| 3,359,434 | 12/1967 | Galluzzi ................................. 361/55 |
| 3,512,044 | 5/1970 | Jones ..................................... 361/55 |
| 3,660,721 | 5/1972 | Baird ..................................... 361/55 |
| 3,872,355 | 3/1975 | Klein et al. . |
| 3,953,766 | 4/1976 | Howell et al. . |
| 4,031,431 | 6/1977 | Gross . |
| 4,163,269 | 7/1979 | Helwig et al. . |
| 4,280,162 | 6/1981 | Tanka et al. . |
| 4,351,012 | 9/1982 | Elms et al. . |
| 4,351,013 | 9/1982 | Matsko et al. . |
| 4,353,103 | 10/1982 | Whitlow . |

Primary Examiner—Patrick R. Salce
Attorney, Agent, or Firm—Cesari and McKenna

[57] ABSTRACT

A foldback power supply (12) is used in an automatic testing device for application of power to a device under test (17). Connection to the device under test is made by means of relay contacts (32, 34, 36, and 38). Arcing and unacceptable transients are avoided by means of a current sink (40) in parallel with the power supply (20). The current sink is operated to draw more than the rated current of the power supply so that the power-supply voltage drops to an acceptable level and the stored energy is simultaneously dissipated. The relay contacts (32, 34, 36, and 38) can then be opened or closed without unacceptably large transients and without the time delays that might otherwise be encountered in waiting for energy dissipation of the energy in the energy-storage elements of the power supply (12) and the device under test (17).

1 Claim, 3 Drawing Figures

SHUNT-FOLDBACK VOLTAGE SOURCE

BACKGROUND OF THE INVENTION

The present invention is directed to automatic test equipment for electronic circuits. It is concerned particularly with the programmable power supplies used in such applications.

In the field of automatic test equipment, a common requirement is that the automatic test device apply a predetermined voltage at a terminal of the device under test. Typically, the tests to be carried out by the automatic equipment should be performed as fast as possible, so the predetermined voltage is applied quickly and, if possible, disconnected quickly.

In order to avoid damage both to the device under test and to the automatic test equipment, completion or interruption of the connection between the power supply and the device under test ordinarily should not be made while a significant voltage is present. If a significant voltage is present, arcing can occur, causing damage to the relay contacts that complete or interrupt the connection. Other transients can also occur, and these can be large enough to damage sensitive electronic components.

In the past, therefore, test sequences have typically included delays between the time when the power supply is turned off and the time when the contacts are opened. Such delays allow the voltage at the terminal to which the power supply is connected to die down. Although this usually is an effective way to avoid damage from transients due to disconnection while voltages are present, it can significantly reduce the speed with which the tests are performed.

In order to speed such tests, manufacturers of automatic test equipment have sometimes employed programmable power supplies of the four-quadrant type. This type of supply is capable of both supplying and drawing current, and it does whichever one is necessary to achieve the voltage to which it is set. For instance, if a four-quadrant power supply is set to 5 volts and is connected across, say, a capacitive load having a potential difference of 10 volts, the four-quadrant power supply draws current to hasten the change to the desired 5-volt level just as it would supply current if the load began at a zero-volt level. This type of supply is advantageous in automatic test equipment because, by setting the supply to zero volts just before it is disconnected from the device under test, it is possible to cause the voltage to reach zero in much less time than it would take if the voltage were merely permitted to die down.

Unfortunately, the cost of a four-quadrant programmable supply can be an order of magnitude higher than that of a simple fixed-voltage current-limited supply. Thus, although the four-quadrant supply affords the desired speed, it can significantly increase the cost of the test equipment.

It is accordingly an object of the present invention to achieve speed similar to that provided by the four-quadrant supply but without incurring the high cost that such supplies entail.

SUMMARY OF THE INVENTION

The foregoing and related objects are achieved in an automatic testing device that uses a switchable shunt circuit in parallel with a foldback power supply that in use is connected to terminals of a device under test. The power supply is a current-limited supply, and a control circuit controls the shunt circuit to cause it to tend to draw more than the maximum current for which the power supply is designed. As a result, the power-supply voltage is reduced to a value that is low enough to permit safe interruption of the connection between the power supply and the device under test. Switch means such as a relay connect the power supply to the device under test, and the control circuit operates the switch means to open the circuit after the voltage has been reduced to a safe level. Operation of the shunt circuit thereby not only turns off the output voltage of the power supply but also speeds the dissipation of energy in the energy-storage elements of the device under test.

BRIEF DESCRIPTION OF THE DRAWINGS

These and further features and advantages of the present invention are described in connection with the accompanying drawings, in which.

DETAILED DESCRIPTION OF THE PREFERRED EMBODIMENT

Figure 1:
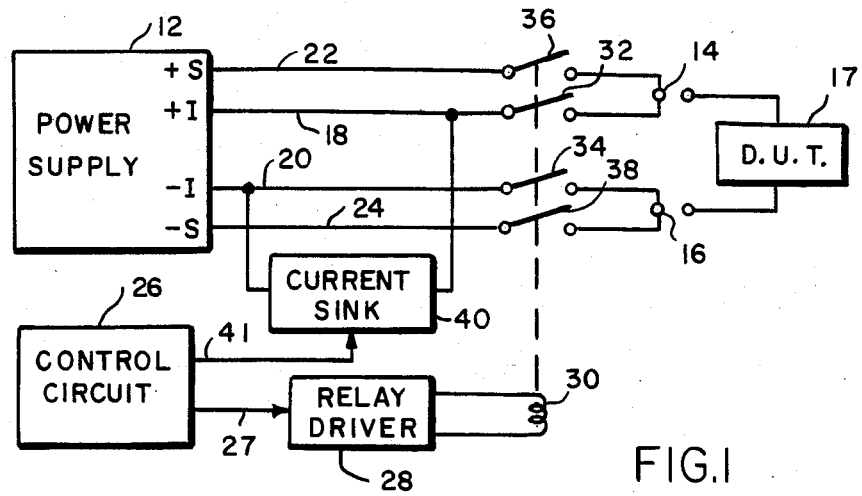
FIG. 1 is a block diagram of a voltage source employing the teachings of the present invention.

FIG. 1 depicts a voltage source used in an automatic testing device. The purpose of the source 10 is to apply a predetermined voltage to a device under test. It includes a power supply 12 whose output voltage is to be presented on output terminals 14 and 16 for application to a device under test (DUT) 17. The output port of the power supply 12 is connected to terminals 14 and 16 by means of main current lines 18 and 20. Sense lines 22 and 24 also lead from the supply 12 to the output terminals 14 and 16. The sense lines 22 and 24 are the conventional means employed in high-accuracy power supplies to provide feedback of the voltage signal to the power supply without the error that might be introduced by voltage drops that result from current flow in the main current lines 18 and 20.

A control circuit 26 controls the functions of the automatic test equipment in general and of the power supply 12 in particular. By control signals sent on a control line 27, the control circuit operates a relay driver 28 that drives the coil 30 of a relay. The relay includes relay contacts 32, 34, 36, and 38 for connecting the power supply 12 to and disconnecting it from the device under test 17. (Those skilled in the art will recognize that it is acceptable in many applications to remove the voltage by opening a single set of contacts, but it is preferable in many cases to open all the lines simultaneously, as is illustrated in FIG. 1.)

In order to avoid arcing across contacts 32, 34, 36, and 38—as well as to prevent possibly damaging transients—it is necessary for the potential difference across terminals 14 and 16 to be reduced to a low level, typically to within a diode drop of zero, before the relay contacts 32, 34, 36, and 38 are opened. In accordance with the present invention, the expensive expedient of employing a four-quadrant supply to achieve fast voltage reduction is avoided by providing the power supply 12 as a simple inexpensive foldback supply and by including a current sink 40 wired in parallel with the power supply 12 across its main current lines 18 and 20. The control circuit 26 applies control signals to the current sink 40 by means of a control line 41 to switch the current sink 40 between a low-current state, in which it draws very little current, and a high-current state, in which the current that it draws is greater than the rated current of the power supply 12. By drawing current, the current sink 40 rapidly discharges energy-storage elements in both the device under test 17 and the power supply 12. At the same time, it causes the power supply 12 to react to the high current flow by reducing its voltage to an insignificant level. Thus, a speed similar to that of a four-quadrant supply is achieved without the attendant costs.

Figure 2:
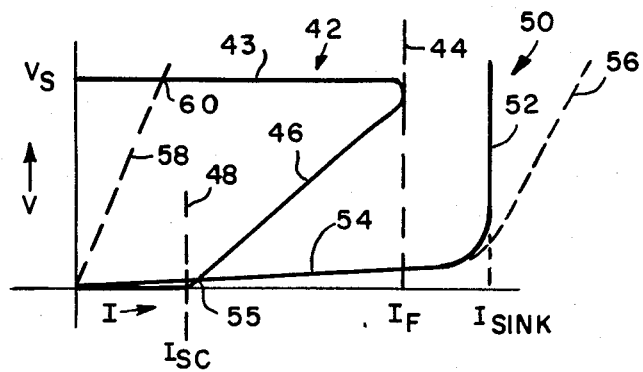
FIG. 2 is a plot of voltage versus current for the power supply and the current sink depicted in FIG. 1.

The operation of the foldback supply 12 and the current sink 40 can be appreciated better by reference to FIG. 2, which includes plots of voltage versus current for the power supply 12 and the current sink 40. In FIG. 2, the plot 42 for the power supply 12 has a horizontal portion 43 that shows the normal, constant-voltage-characteristic operation of the power supply. Throughout a range of currents beginning at zero and extending to a foldback current $I_F$ depicted by dashed line 44, the voltage at the output port of the power supply 12 remains substantially constant at a predetermined value $V_S$. Once the foldback current $I_F$ is exceeded, however, the static characteristic of the power supply 12 changes to that depicted in the foldback portion 46 of the curve 42. In this part of the curve, the small-signal output impedance of the power supply is negative: as the output current decreases, the output voltage also decreases. In other words, as the load impedance decreases, so does the output current of the power supply 12, and it does so until it reaches a short-circuit current $I_{SC}$ depicted by dashed line 48 in FIG. 2.

FIG. 2 also shows the voltage-versus-current characteristic exhibited by the current sink 40 when it is in its high-current state. This plot 50 has a generally vertical portion 52, representing the high small-signal impedance of a current sink. In this portion of the curve, the current drawn by the current sink 40 remains essentially constant throughout a wide range of voltages. It is only when the voltage falls to an extremely low level that the current drawn by the current sink decreases, as portion 54 of the current-sink plot 50 indicates.

The voltage source 10 is so arranged that the current sink 40 is in its high-current state when the source 10 is first turned on and the device under test 17 typically is not yet connected to it. Consequently, the voltage at the power-supply output port is initially the very low value indicated by the point 55 in FIG. 2 at which the current-sink plot 50 intersects the power-supply plot 42.

The device under test 17 is then connected across output terminals 14 and 16, and the control circuit 26 operates the relay coil 30 to close the relay contacts 32, 34, 36, and 38. When the contacts close, the conductance of the device under test 17 is placed in parallel with that of the current sink 40, so the composite voltage-current characteristic of the current sink 40 and the device under test 17 changes from the higher-voltage portion 52 of the plot 50 to the curve indicated by the dashed line 56. It is substantially identical in the low-voltage portion 54 to the plot of the current sink alone, though, so the operating point remains that indicated by reference numeral 55. Because of the very low value of the voltage at the output port of the power supply 12, any transients that result when the contacts close are minimal and cause no damage.

The control circuit 26 then turns off the current sink 40. As a result, the composite voltage-current plot of the current sink 40 and the device under test 17 changes to that indicated by dashed line 58, which is the current-voltage curve of the device under test 17. The operating point therefore changes to the point indicated by reference numeral 60, and the voltage across the device under test 17 becomes the desired voltage, $V_S$.

When the time comes to remove the voltage from the device under test 17, the control circuit 26 first switches on current sink 40 to cause it to draw the sink current $I_{SINK}$, which is greater than the foldback current $I_F$. The sudden load provided by the current sink 40, together with reactance caused by the high parallel capacitance in the power supply 12, causes the operating point to move momentarily to the right of the power-supply plot 42. During this short interval, the current sink 40 dissipates stored energy in the reactive elements in both the device under test 17 and the power supply 12, and the operation passes through points that are outside the curves of FIG. 2. This dominance of the reactive elements is quickly reduced, and operation returns to the power-supply plot 42 at the lower operating point 55. At this operating point 55, the voltage is low enough that the relay can be operated without causing any damage, and the control circuit 26 accordingly operates relay driver 28 to open the contacts 32, 34, 36, and 38.

Thus, by drawing a high current, the current sink 40 not only switches the foldback supply 12 to a mode of operation in which it no longer maintains a high voltage but also hastens dissipation of energy from reactive elements of the power supply 12 and the device under test 17. Furthermore, because the power supply 12 is a foldback supply, the operating point 55 represents not only a very low voltage but also a relatively low current, so there is substantially less power dissipation than there would be if the power supply 12 had a voltage-current characteristic in which the portion 46 is nearly vertical.

Figure 3:
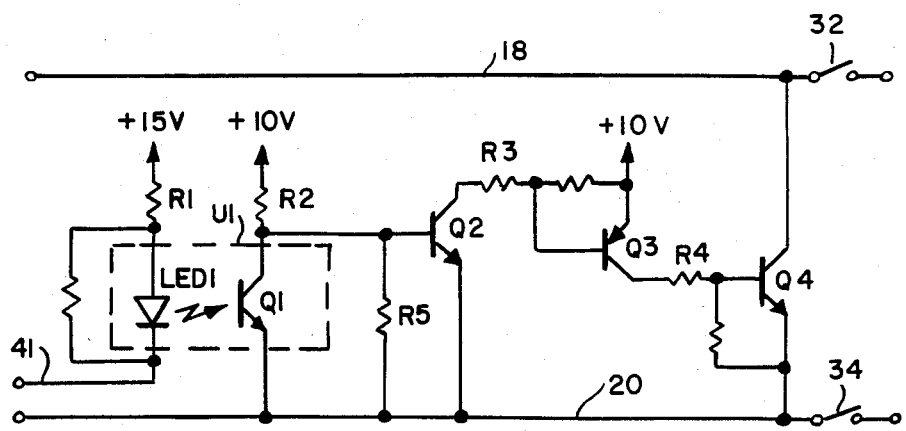
FIG. 3 is a schematic diagram of the current sink and related elements depicted in FIG. 1.

FIG. 3 is a schematic diagram of a practical version of the current sink 40. The version in FIG. 3 is slightly simplified because the current sink is applied in most instances to more than one power-supply port; the power supply might have +5—volt, +15—volt, and −15—volt output ports, for instance, and the current sink would typically be arranged to sink current from all of them simultaneously. To simplify understanding of the principles of operation, however, the FIG. 3 circuit is shown as being connected across only one port.

The circuit of FIG. 3 includes an optical isolator U1, which includes a light-emitting diode LED1. The anode of LED1 is connected through a resistor R1 to a positive supply, and its cathode is connected to control line 41 from the control circuit 26. The optical isolator U1 also includes a light-sensitive transistor Q1, which is connected to draw current through a load resistor R2 when it receives light emitted by LED1. The voltage at the collector of Q1 is applied to the base of a further transistor Q2, whose emitter is in turn connected by a resistor R3 to the base of a pnp transistor Q3. The collector of Q3 is connected by a resistor R4 to the base of a current-sink transistor Q4, whose collector and emitter are connected to the main current lines 18 and 20, respectively. When Q4 is turned on, it sinks current from the power supply to perform the functions described in connection with FIG. 2.

The control line 41 presents an open circuit to the light-emitting diode LED1 when the circuit 10 is first turned on, so Q1 does not conduct. As a result, Q1 draws almost no current through R2, so R2 and a further resistor R5 tend to divide 10 volts between them in proportion to their resistances. The relative resistance of R5 is high enough that Q2 is turned on by the voltage at its base. Transistor Q2 thus draws current from the base of Q3, turning it on and applying a fixed drive to Q4. Transistor Q4 which accordingly draws the fixed sink current $I_{SINK}$ so long as a significant potential difference exists between the power lines 18 and 20. However, since this fixed current is greater than the foldback current of the power supply 12, the power supply operates in the foldback region so that the potential difference between the power lines 18 and 20 is less than the voltage required to maintain $I_{SINK}$, and operation accordingly takes place initially at operating point 55 of FIG. 2. When the circuit 10 is first turned on, therefore, the voltage at the output port of power supply 12 is low.

The control circuit 26 then operates the relay driver 28 to close contacts 32 and 34 of FIG. 3 to connect the power supply 12 to the device under test 17. Once that connection has been made, the control circuit 26 applies ground potential through control line 41 to the optical isolator U1, thereby turning on LED1, which in turn causes a flow of current in the light-sensitive transistor Q1. This draws enough current through the load resistor R2 to drop the emitter voltage of Q1 below the level required to keep Q2 turned on. Q2 accordingly ceases conducting and thereby turns off Q3, removing the base drive from Q4 and thus turning off the current shunt. The supply voltage therefore rises, as was discussed in connection with FIG. 2, and operation continues as was previously described.

It is thus apparent that the present invention avoids the expense that attends the use of four-quadrant supplies and yet achieves the rapid dissipation of energy from energy-storage devices that has in the past been a characteristic of such supplies only. A current sink used as described above simultaneously dissipates stored energy and causes an inexpensive foldback supply to reduce its voltage to a level that is safe for switching.

I claim:
1. A programmable power supply having an output terminal adapted for connection to a device under test, the programmable power supply comprising:
   A. a foldback power supply, having an output port, for providing a predetermined output voltage at its output port until the current drawn by its load reaches a predetermined maximum, the foldback supply reducing both its output voltage and its output current when the predetermined maximum current is exceeded;
   B. switch means connected between the output port and the output terminal and operable by application of control signals thereto selectively to complete and interrupt electrical connection between the output port and the output terminal;
   C. a shunt circuit connected in parallel with the power supply and operable by application of control signals thereto to tend to draw more than the predetermined maximum current from the current-limited power supply; and
   D. a control circuit, connected for application of control signals to the switch means and the shunt circuit, for first applying signals to operate the shunt circuit to tend to draw more than the rated current from the foldback power supply to cause the supply voltage to drop to a low value and for then applying control signals to the switch means to open it to disconnect the foldback supply from any device under test connected to the output terminal.

* * * * *